US 6,692,898 B2

(12) United States Patent
Ning

(10) Patent No.: US 6,692,898 B2
(45) Date of Patent: Feb. 17, 2004

(54) SELF-ALIGNED CONDUCTIVE LINE FOR CROSS-POINT MAGNETIC MEMORY INTEGRATED CIRCUITS

(75) Inventor: Xian J. Ning, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 130 days.

(21) Appl. No.: 09/923,266

(22) Filed: Aug. 3, 2001

(65) Prior Publication Data
US 2002/0098281 A1 Jul. 25, 2002

Related U.S. Application Data
(60) Provisional application No. 60/263,990, filed on Jan. 24, 2001.

(51) Int. Cl.[7] .............................. G03F 7/00; H01L 21/00
(52) U.S. Cl. ...................... 430/311; 430/313; 430/314; 430/316; 430/317; 430/318; 430/319; 427/127; 438/3
(58) Field of Search ................................. 430/311, 313, 430/314, 316, 317, 318, 319; 427/127; 438/3

(56) References Cited

U.S. PATENT DOCUMENTS

| 5,331,728 | A | * | 7/1994 | Argyle et al. ............... 29/603 |
| 5,695,810 | A | | 12/1997 | Dubin et al. ................ 427/96 |
| 5,838,608 | A | | 11/1998 | Zhu et al. .................. 365/158 |
| 5,940,319 | A | * | 8/1999 | Durlam et al. .............. 365/171 |
| 6,169,686 | B1 | | 1/2001 | Brug et al. ................. 365/171 |
| 6,259,644 | B1 | | 7/2001 | Tran et al. .................. 365/209 |
| 6,391,216 | B1 | | 5/2002 | Nakatani .................... 216/41 |
| 2002/0096775 | A1 | * | 7/2002 | Ning ........................ 257/763 |
| 2002/0097600 | A1 | * | 7/2002 | Ning ........................ 365/171 |
| 2002/0098281 | A1 | * | 7/2002 | Ning ........................ 427/129 |
| 2002/0132464 | A1 | * | 9/2002 | Lee .......................... 438/618 |

FOREIGN PATENT DOCUMENTS

| EP | 0918334 A2 | | 5/1999 |
| GB | 2331273 A | | 5/1999 |
| WO | WO 02/065475 | * | 8/2002 |

OTHER PUBLICATIONS

Hu, Y.Z., et al.; "Chemical–mechanical polishing as an enabling technology for giant magnetoresistance devices." Thin Solid Films, Elsevier–Sequoia S.A. Lausanne, Ch., vol. 308–309, No. 1–4; Oct. 31, 1997 pp. 555–561.

Walsh, Michael E., et al. "Optimization of a lithographic and ion beam etching process for nanostructuring magnetoresistive thin film stacks." 44th Int'l Conference on Electron Ion, and Photon Beam Technology and Nanofabrication, Rancho Mirage CA, USA, May 30–Jun. 2, 2000; vol. 18 No. 6; pp. 3539–3543.

* cited by examiner

Primary Examiner—Mark F. Huff
Assistant Examiner—Nicole Barreca
(74) Attorney, Agent, or Firm—Slater & Matsil, L.L.P.

(57) ABSTRACT

Method of forming a magnetic memory device are disclosed. In one embodiment, a first plurality of conductive lines are formed over a semiconductor workpiece. A plurality of magnetic material lines are formed over corresponding ones of the first plurality of conductive lines and a second plurality of conductive lines are formed over the semiconductor workpiece. The second plurality of conductive lines cross over the first conductive lines and the magnetic material lines. These second lines can be used as a mask to while the magnetic material lines are patterned.

15 Claims, 5 Drawing Sheets

SELF-ALIGNED CONDUCTIVE LINE FOR CROSS-POINT MAGNETIC MEMORY INTEGRATED CIRCUITS

This patent claims the benefit of the filing date of provisionally filed patent application Serial No. 60/263,990, filed Jan. 24, 2001, and incorporated herein by reference.

FIELD OF THE INVENTION

The preferred embodiment of the present invention generally relates to cross-point magnetic memory integrated circuits (ICs). More particularly, the preferred embodiment relates to self-aligned conductive lines for cross-point magnetic memory ICs.

BACKGROUND OF THE INVENTION

"FIG. 1a shows a cross-section of magnetic memory IC 101. The memory IC comprises a plurality of magnetic memory cells in an array region 103 of the IC. The cells each comprises a magnetic stack 120 sandwiched between upper and lower metal lines 140 and 150. The upper and lower metal lines run in orthogonal directions embedded in inter-level dielectric (ILD) layers 110a and 110b. The upper and lower metal lines serve as bitlines and wordlines of the memory array. A cell is located at an intersection of a bitline and wordline."

The alignment of the various layers of the memory cells become more critical as ground rules decreases. For example, misalignments among the layers can result in line-to-line and/or level-to-level electrical shorts.

SUMMARY OF THE INVENTION

As evident from the foregoing discussion, it is desirable to provide a process for forming magnetic memory cells which avoids or reduces misalignments of the various layers used to form the cells.

In a first aspect, the present invention provides a method of forming a magnetic memory device. A first plurality of conductive lines (e.g., bitlines or wordlines) are formed over a semiconductor workpiece. A plurality of magnetic material lines are formed over corresponding ones of the first plurality of conductive lines. A second plurality of conductive lines are formed over the semiconductor workpiece. The second plurality of conductive lines cross over the first conductive lines and the magnetic material lines. These second lines, which can serve as either the bitline or wordline, can be used as a mask to while portions of the magnetic material lines are removed.

In another aspect, the present invention provides another method of forming an integrated circuit device. This method can be combined with the first method described but does not need to be. In this method, a magnetic material layer is formed over a workpiece and a metallic hard mask is formed over the magnetic material layer. The metallic hard mask is patterned and used as a mask to etch portions of the magnetic material layer. A dielectric layer is formed over remaining portions of the magnetic material layer. A chemical-mechanical polish can then be performed to planarize the dielectric layer. The metallic hard mask can serve as an etch stop for the chemical-mechanical polish.

In yet another aspect, the present invention provides another technique that can be combined with either or both of the above-mentioned methods. This method can also be used independently. In this method, an insulating layer is formed over a magnetic material layer. A number of trenches are formed in the insulating layer and filled by a conductive material to form a plurality of conductive lines. Remaining portions of the insulating layer are then removed. Portions of the magnetic material layer can then be removed using the conductive lines as a mask.

In its various aspects, the present invention has a number of advantages over prior art methods. Some of these advantages of certain embodiments include avoiding the short between first conductive lines 140 and second conductive lines 150. The problem that is avoided can be clearly seen in FIG. 1b where the misalignment of the second conductive line 150 to magnetic stack 120 results in an electrical short between the first and second conductive lines 140 and 150.

Aspects of the present also have the advantage that additional process steps that are required to prevent M2 to M3 shorting, such as a dielectric deposition and planarization to form the isolation in between the magnetic stacks 120 can be avoided. As a result, reductions in cost are achieved. Yield can also be increased.

BRIEF DESCRIPTION OF THE DRAWINGS

The above features of the present invention will be more clearly understood from consideration of the following descriptions in connection with accompanying drawings in which.

DETAILED DESCRIPTION

In a CU damascene back-end-of-line structures, magnetic metal stacks are embedded to manufacturing the magnetic random access memory (MRAM) devices. The magnetic stack consists of many different layers of metals and a thin layer of dielectric with total thickness of a few tens of nanometers. For the cross-point MRAM structures, the magnetic stack is located at the intersection of the two metal wiring levels, for example metal 2(M2) and metal 3 (M3) that are running in the orthogonal directions embedded in inter level dielectrics (ILD). The magnetic stack is contacted at bottom and top to M2 and M3 wiring levels, respectively.

In various aspects, the present invention provides various techniques to improve the fabrication process for forming a magnetic memory devices. The techniques will be discussed with reference to FIGS. 2–9, which illustrate a preferred embodiment fabrication process.

FIGS. 2–9 show a process for fabricating a magnetic memory integrated circuit (IC) 101 in accordance with one embodiment of the invention. Each cross-section is provided in orthogonal views, labeled with an a or b appended to the Figure number.

Figure 1A:
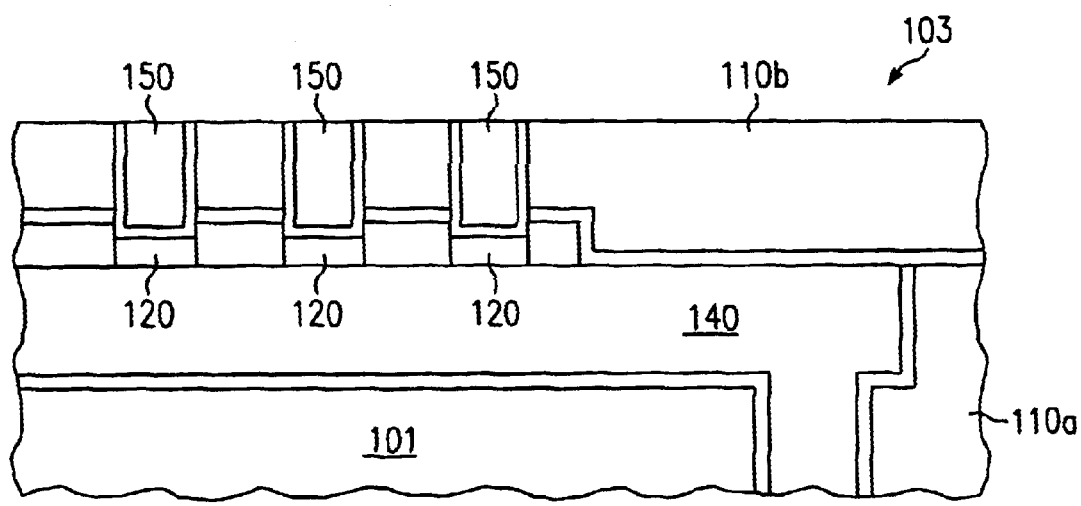
"FIGS. 1a and 1b shows a cross-sectional view of a known magnetic memory device; and".
Figure 1B:
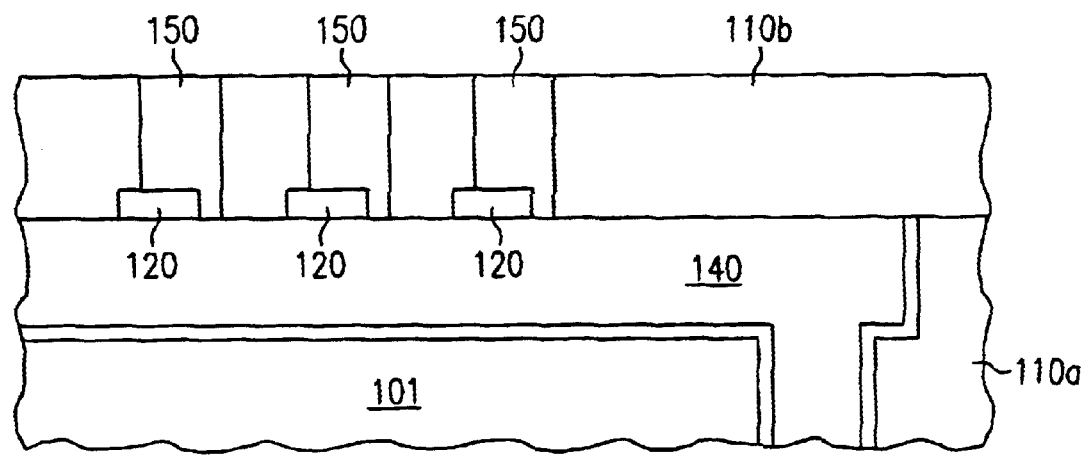
Figure 2A:
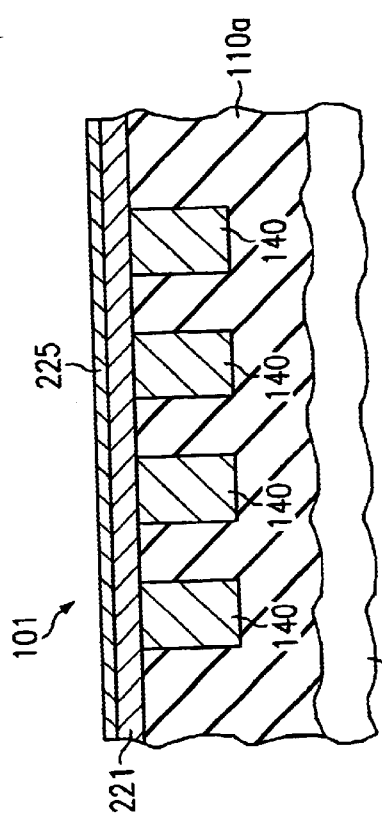
FIGS. 2a,b through 9a,b show cross-section views of a magnetic memory device during various stages of fabrication.
Figure 2B:
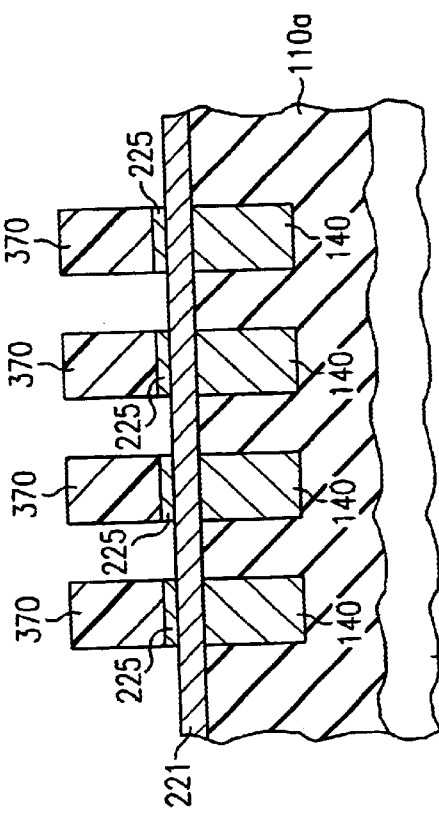

Referring now to FIGS. 2a and 2b, a prepared substrate 205 is provided with an interlevel dielectric (ILD) layer 110a is shown. First conductive lines 140 which run in a first direction are formed in the ILD layer. The first conductive lines 140, for example, are referred to as either wordlines or bitlines of the memory array. The first conductive lines typically are located on a second metal or conductive level (M2) of the IC. A lower metal level (M1) and circuit elements (not shown) are formed below the ILD layer.

In one embodiment, each conductive line 140 comprises copper or copper alloy. Other types of conductive material, such as tungsten and aluminum, can also be used to form the conductive lines. The conductive lines can be formed using conventional damascene or reactive ion etch (RIE) techniques. Such techniques are described in, for example, S. Wolf and R. Tauber, Silicon Processing for the VLSI Era, Lattice Press (2000), and the references used therein, which is/are herein incorporated by reference for all purposes. The conductive lines can include a Ta, TaN, TiN, W liner, which promote the adhesion and prevent the diffusion of the metal to the dielectric where the lines embedded in.

A magnetic layer 221 is deposited over the dielectric 110a and conductive lines 140. The magnetic layer 221, in one embodiment, comprises PtMn, CoFe, Ru, $Al_2O_3$, and/or NiFe as examples. Other types of magnetic material, such as Ni, Co, and various ratio of the compounds mentioned above, can also be used. The magnetic layer is deposited by, for example, physical vapor deposition (PVD), evaporation, chemical vapor deposition (CVD) or other suitable techniques.

In accordance with the preferred embodiment of the invention, a hard mask layer 225 is deposited over the magnetic layer 221. In one embodiment, the hard mask layer comprises tantalum, tungsten, or titanium, including their compounds, such as tantalum nitride or titanium nitride. Other types of hard mask materials, such as PECVD silicon oxide, silicon nitride, silicon carbide can also be used.

The hard mask layer 225 is deposited by, for example, physical vapor deposition (PVD) or chemical vapor deposition (CVD), including plasma enhanced CVD (PECVD). The thickness of the hard mask layer 225 is sufficient to serve as a hard mask for etching the magnetic layer 221. In one embodiment, the hard mask layer 221 is about 10–60 nm, e.g., about 20–40-nm.

Figure 3A:
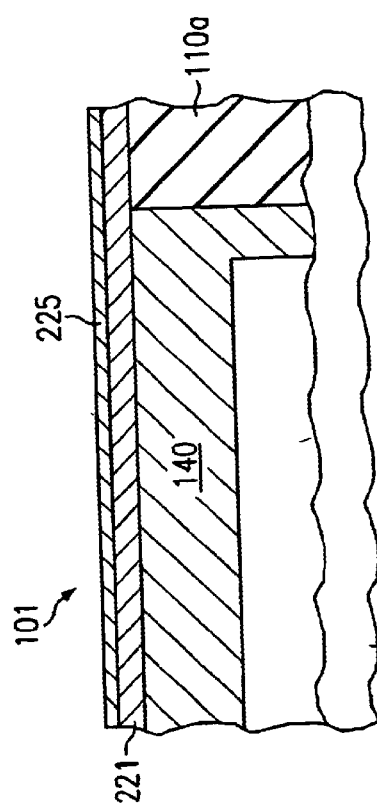
Figure 3B:
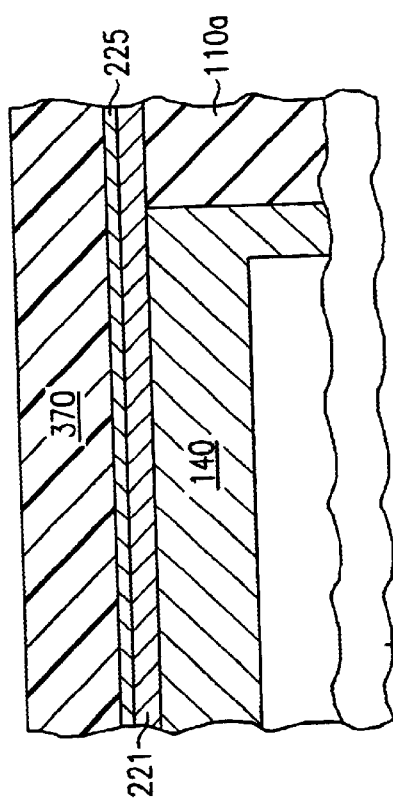

Referring to FIGS. 3a and 3b, a resist layer 370 is formed on the hard mask layer 221 and patterned to form openings therein. Patterning of the resist includes selectively exposing the resist with an exposure source (not shown) through a mask (not shown). The resist 370 is then developed, removing the exposed or unexposed portions of the resist (depending on whether a positive or negative type resist is used) to form the openings. In one embodiment, the pattern of the resist corresponds to the conductive lines 140. For positive resist applications, in the active device array region a reverse M2 pattern is used. Alternatively, for negative resist applications, the M2 mask pattern is used.

An etch is then performed to remove portions of the hard mask layer 225 unprotected by the resist layer. The etch, for example, comprises a reactive ion etch (RIE). Other techniques, such as a wet etch or ion milling, can also be used to pattern the metallic layer. After the hard mask layer 225 is patterned, the resist layer 370 is removed.

In some applications, an anti-reflective coating (ARC) (not shown) can be formed on the hard mask layer 225 prior to depositing the resist the resist layer 370. The use of ARC is useful to enhance lithographic resolution by reducing reflection of radiation from the exposure source. If an ARC is used, it is removed along with the resist layer 370 after the hard mask layer 225 is patterned.

Figure 4A:
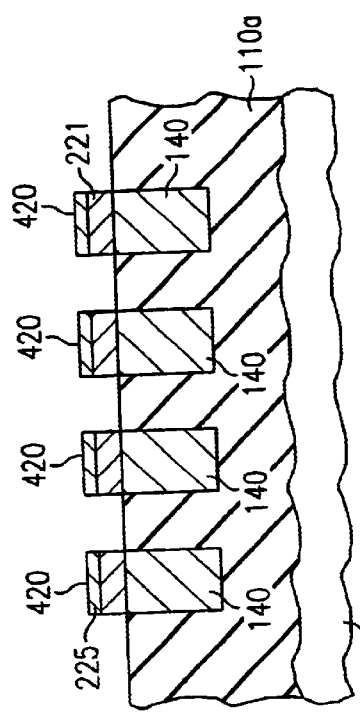
Figure 4B:
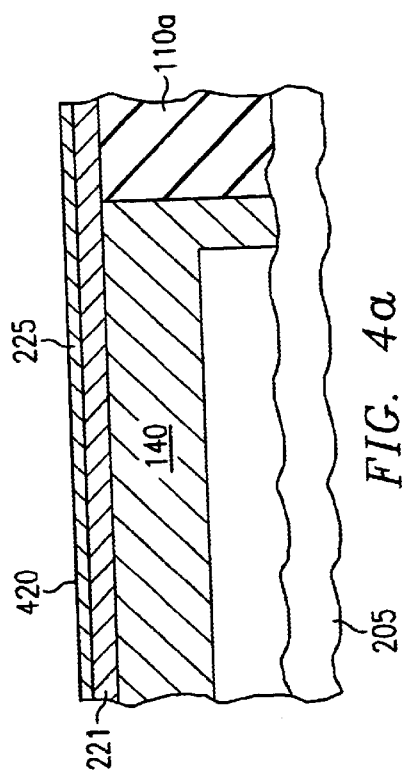

Referring to FIGS. 4a and 4b, the patterned hard mask layer 225 serves as an etch mask for patterning the magnetic layer 221. The magnetic layer 221 is patterned by, for example, an RIE to form rows or strips 420 of magnetic stacks contacting conductive lines 140. Other techniques, such as a wet etch or ion milling, can also be used to pattern the hard mask layer 225.

Figure 5A:
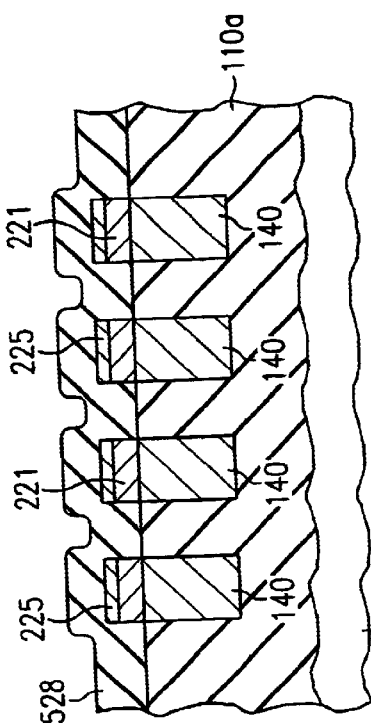
Figure 5B:
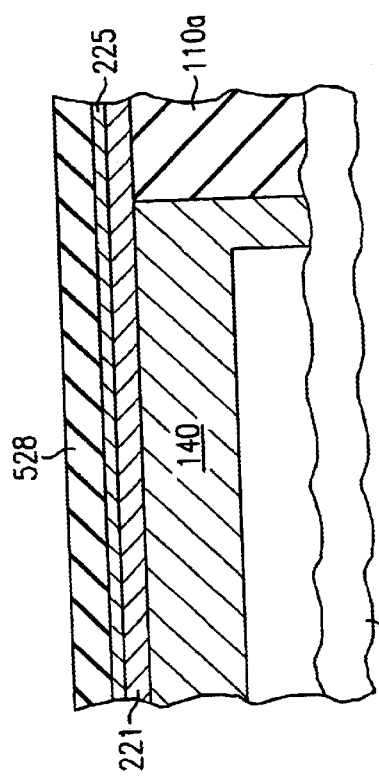

Referring to FIGS. 5a and 5b, a dielectric layer 528 is deposited on the substrate, filling the spaces between the magnetic stacks 221. In one embodiment, the dielectric layer 528 comprises silicon nitride (e.g., $Si_3N_4$). Other types of dielectric layers can alternatively (or also) be used. In the preferred embodiment, a plasma enhanced CVD silicon nitrite film with a thickness of about 30 nm to about 150 nm, preferably about 50 nm to about 70 nm is deposited at a temperature below 350° C.

Figure 6B:
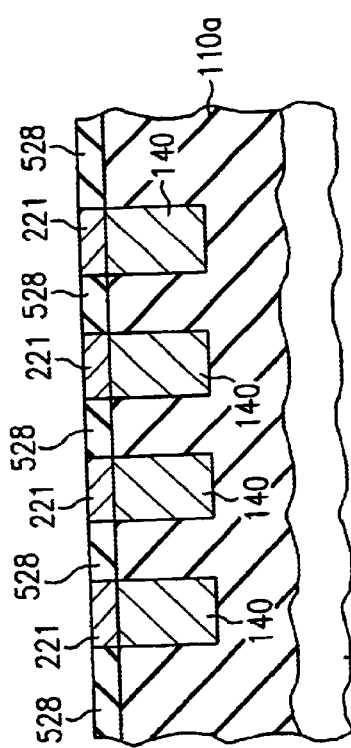
Figure 6A:
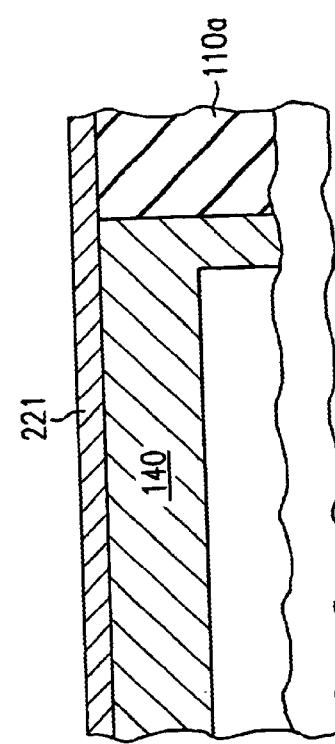

The dielectric layer 528 is planarized with, for example, a chemical mechanical polish (CMP), as shown in FIGS. 6a and 6b. The CMP is selective to the hard mask layer 225 (e.g., etch stop), creating a substantially planar surface which is substantially co-planar with the top of the magnetic stacks.

Figure 7B:
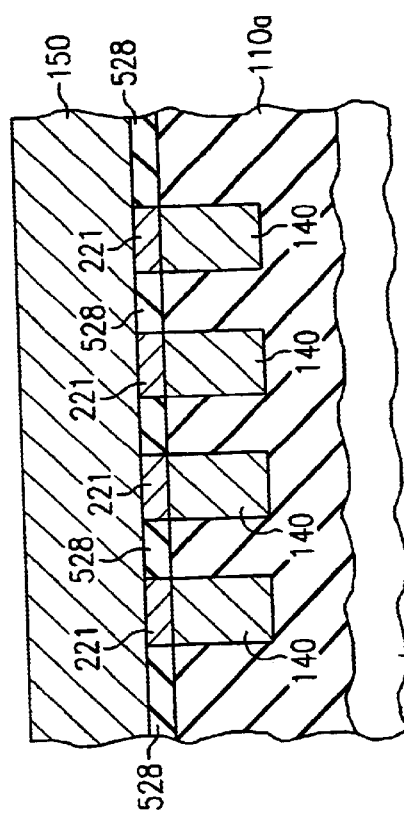
Figure 7A:
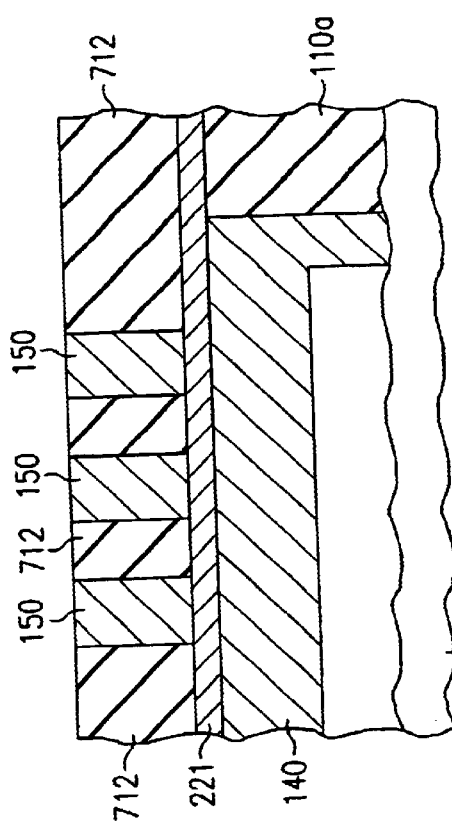

In FIGS. 7a and 7b, second conductive lines 150 are formed over the substrate above the ILD 110a, isolated by a dielectric layer 712, such as silicon oxide. Other dielectric layers, such as Silk, porous silk, hydrogen silsesquioxane (HSQ),fluorinated glass, or fluorinated oxide, that can be removed selective to the conductive line 150 can also be used.

Typically, the second conductive lines 150 are located in a third metal level (M3). The conductive line 150 can be formed using copper, copper alloy, or other types of conductive material such as W and Al. In one embodiment, the conductive line comprises copper or its alloy. The second conductive lines 150 can be formed from the same or a different material than the first conductive lines 140.

The second conductive lines 150 cross the first conductive lines 140 and are referred to either as bitlines or wordlines. In the preferred embodiment, the second conductive lines 150 run in an orthogonal direction to the first conductive lines. Providing second conductive lines 150 that intersect first conductive lines 140 at angles other than 90° is also useful.

In one embodiment, the second conductive lines 150 are formed using conventional damascene techniques. This technique will now be described. The process includes, depositing a dielectric layer 712, such as silicon oxide (e.g., $SiO_2$), by CVD, as an example. In an alternative embodiment, the dielectric layer 712 comprises silicon nitride to avoid oxidizing the subsequently formed copper lines. Other types of dielectric material can also be used, depending on the application. Other deposition techniques are also useful.

The dielectric layer 712 is planarized, if necessary, to provide a planar surface. The dielectric layer 712 is then patterned with a resist mask (not shown) to form trenches. After the trenches are formed, the resist mask is removed. A conductive material, such as copper is deposited to fill the trenches. Optionally, a conductive liner (not shown), such as W and Al, can be deposited to line the trench. A CMP is used to remove excess conductive material and to form a planar surface with the dielectric layer 712.

Optionally, a cobalt phosphide (CoP) or cobalt tungsten phosphide (CoWP) layer is deposited over the conductive material 150 by electroless plating deposition. Such a technique is described in, for example, U.S. Pat. No. 5,695,810 issued to Dubin et al., which is herein incorporated by reference for all purposes. The CoP or CoWP layer advantageously reduces erosion when the conductive lines 150 are used as an etch mask during subsequent processing.

Figure 8B:
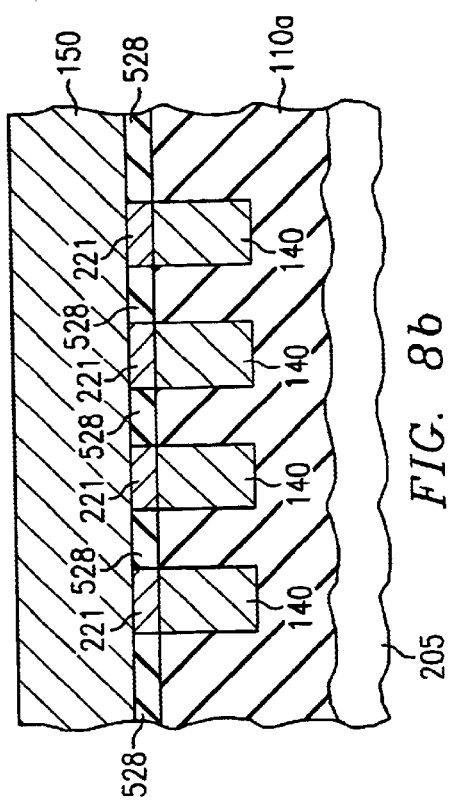
Figure 8A:
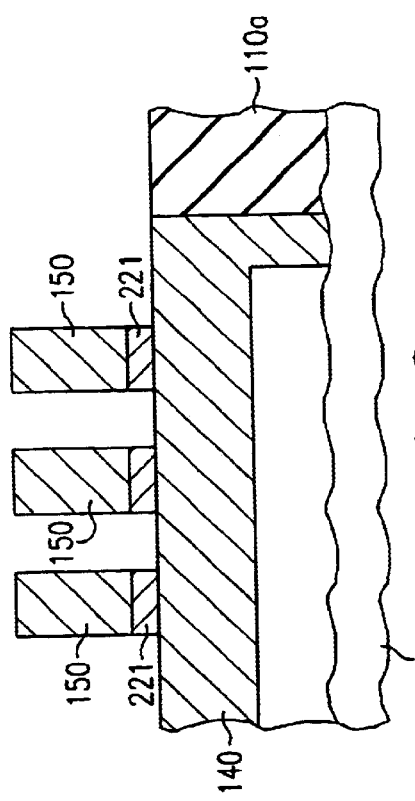

Referring to FIGS. 8a and 8b, the dielectric layer 712 is removed, e.g., by means of RIE, leaving conductive lines 150 on the substrate. The conductive lines 150 serve as an etch mask for removing portions of the magnetic stacks 521 exposed by the removal of the dielectric layer 721. As a result, the etch forms conductive lines 150 over the magnetic stacks 221 which are self-aligned, thus reducing misalignment problems.

An alternative approach here is to use Al as metal lines 150 in FIGS. 7 and 8. Instead of damascene process, the Al stack is deposited on the surface of 225 in FIG. 6. In one embodiment, the Al stack includes a Ti and TiN barrier and/or a TiN cap layer. The deposition of the stack can be done by PVD. The Al stack is then lithographically patterned followed by RIE to transfer pattern to the Al stack as well as magnetic stack in the same process as shown in FIG. 8.

Figure 9B:
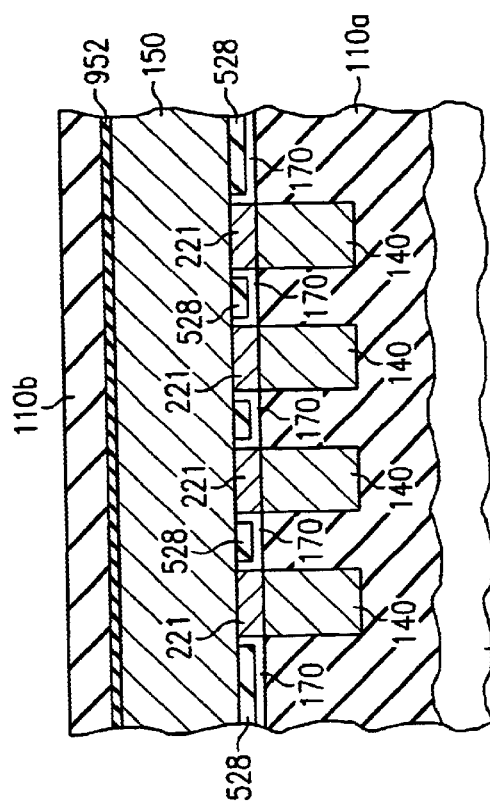
Figure 9A:
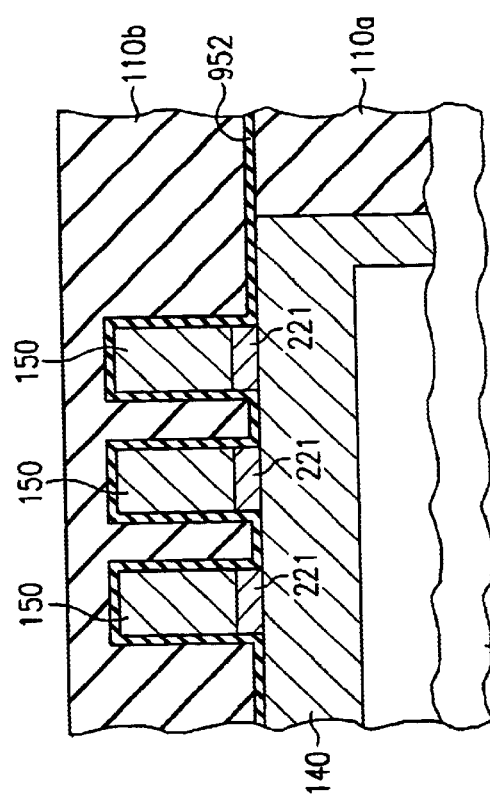

Referring to FIGS. 9a and 9b, a dielectric liner 952 is deposited on the substrate, lining the conductive lines 150. The liner 952 comprises, for example, silicon nitride. In other embodiments, the dielectric can be a low k dielectric such as HSQ, Silk, porous silk, or formed with air gaps using poor gap filling materials.

In one embodiment, the liner layer 952 is deposited by PECVD. Other techniques for depositing the liner layer are also useful. The liner layer prevents oxidation of the copper lines 150 by the subsequently formed silicon oxide ILD layer 110b. Typically, the liner layer 952 is about 2–30 nm, preferably about 5–15 nm. A nitride liner can be avoided if a silicon nitride ILD layer or conductive materials other than copper are used.

While not shown, the process continues to complete processing of the MRAM IC. These additional steps are left out to simplify illustration of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a magnetic memory device, the method comprising:

forming a first plurality of conductive lines over a semiconductor workpiece;

forming a plurality of magnetic material lines over corresponding ones of the first plurality of conductive lines;

forming an insulating layer over the plurality of magnetic material lines;

forming a plurality of trenches within the insulating layer, each trench exposing portions of the each of the plurality of magnetic material lines;

forming a second plurality of conductive lines within the trenches, the second plurality of conductive lines crossing over the first plurality of conductive lines and the plurality of magnetic material lines;

removing remaining portions of the insulating layer to expose portions of the plurality of magnetic material lines that are not underlying the second plurality of conductive lines;

removing portions of the plurality of magnetic material lines using the second plurality of conductive lines as a mask; and forming a second insulating material within trenches between the second plurality of conductive lines.

2. The method of claim 1 wherein the first plurality of conductive lines comprises a plurality of copper lines.

3. The method of claim 1 wherein the plurality of magnetic material lines are formed from a material selected from the group consisting of PtMn, CoFe, Ru, $Al_2O_3$, NiFe, Ni, Co, and combinations thereof.

4. The method of claim 1 wherein forming a plurality of magnetic material lines comprises forming a layer of magnetic material and patterning and etching the layer of magnetic material, the method further comprising forming a hard mask layer over the layer of magnetic material and using the hard mask layer as a mask when patterning and etching the layer of magnetic material.

5. The method of claim 4 wherein the hard mask layer comprises a metallic layer.

6. The method of claim 5 wherein the hard mask layer is formed from a material that includes a metal selected from the group consisting of Ta, W, and Ti.

7. The method of claim 1 and further comprising forming a dielectric layer over the workpiece and between ones of the plurality of magnetic material lines prior to forming the second plurality of conductive lines.

8. The method of claim 1 and further comprising depositing a liner over the second plurality of conductive lines prior to forming the second insulating material.

9. The method of claim 1 wherein forming a second plurality of conductive lines comprises forming a second plurality of conductive lines that are orthogonal to the first plurality of conductive lines.

10. The method of claim 1 wherein forming a plurality of magnetic materials lines comprises:

forming a magnetic material layer over the workpiece;

forming a metallic hard mask over the magnetic material layer;

patterning the metallic hard mask;

etching portions of the magnetic material layer using the metallic hard mask as a mask;

forming a dielectric layer over the workpiece; and performing a chemical-mechanical polish to planarize the dielectric layer, wherein the metallic hard mask serves as an etch stop for the chemical-mechanical polish.

11. The method of claim 10 wherein the metallic bard mask is patterned to expose portions of the magnetic material layer overlying the first plurality of conductive lines.

12. The method of claim 10 wherein the insulating layer is formed over the planarized dielectric layer.

13. The method of claim 10 wherein the magnetic material comprises a material selected from the group consisting of PtMn, CoFe, Ru, $Al_2O_3$, NiFe, Ni, Co, and combinations thereof.

14. The method of claim 10 wherein the metallic hard mask comprises a material that includes a metal selected from the group consisting of Ta, W, and Ti.

15. The method of claim 1 wherein the second conductive lines comprise copper and wherein forming a second insulating material includes depositing an oxide.

* * * * *